(12) United States Patent
Noda

(10) Patent No.: US 9,049,809 B2
(45) Date of Patent: Jun. 2, 2015

(54) APPARATUS AND METHOD FOR MANUFACTURING DOUBLE-SIDED MOUNTING SUBSTRATE

(71) Applicant: Samsung Techwin Co., Ltd., Changwon (KR)

(72) Inventor: Takahiro Noda, Changwon (KR)

(73) Assignee: SAMSUNG TECHWIN CO., LTD., Changwon (KR)

( * ) Notice: Subject to any disclaimer, the term of this patent is extended or adjusted under 35 U.S.C. 154(b) by 203 days.

(21) Appl. No.: 13/718,186

(22) Filed: Dec. 18, 2012

(65) Prior Publication Data
US 2013/0160288 A1 Jun. 27, 2013

(30) Foreign Application Priority Data

Dec. 26, 2011 (JP) .................................. 2011-283576
May 16, 2012 (KR) ......................... 10-2012-0052205

(51) Int. Cl.
| | | |
|---|---|---|
| B23P 19/00 | (2006.01) | |
| H05K 13/04 | (2006.01) | |
| H05K 3/30 | (2006.01) | |
| H05K 13/00 | (2006.01) | |
| H05K 3/34 | (2006.01) | |

(52) U.S. Cl.
CPC ............ *H05K 13/04* (2013.01); *Y10T 29/4913* (2015.01); *Y10T 29/53174* (2015.01); *H05K 3/30* (2013.01); *H05K 3/3415* (2013.01); *H05K 13/0061* (2013.01)

(58) Field of Classification Search
CPC ..... H05K 13/04; H05K 13/0061; H05K 3/30; H05K 3/3415; Y10T 29/4913
USPC ................ 29/739, 729, 700, 740, 741, 281.4, 29/281.1
See application file for complete search history.

(56) References Cited

U.S. PATENT DOCUMENTS 5,711,065 A * 1/1998 Asai et al. ........................ 29/740
8,037,588 B2 * 10/2011 Lee .............................. 29/281.4

FOREIGN PATENT DOCUMENTS

| JP | 11-289193 A | 10/1999 |
|---|---|---|
| JP | 2009-064971 A | 3/2009 |
| KR | 10-2007-0004350 A | 1/2007 |
| KR | 10-2008-0092704 A | 10/2008 |

* cited by examiner

*Primary Examiner* — Peter DungBa Vo
*Assistant Examiner* — Azm Parvez
(74) *Attorney, Agent, or Firm* — Sughrue Mion, PLLC

(57) ABSTRACT

Provided is an apparatus for manufacturing a double-sided mounting substrate, the apparatus including: a backup table provided under the printed circuit board at the mounting position which supports the lower surface of the printed circuit board; and a servo motor which elevates and lowers the backup table, wherein the servo motor elevates the backup table to mount the new electronic components and lowers the backup table to carry-in and to carry-away the printed circuit board based on a lower limit position of the backup table, and wherein the lower limit position of the backup table is a position separated downwardly from a reference surface at the mounting position by a distance obtained by adding a preset clearance to a sum of a maximum height of the mounted electronic components mounted on the lower surface of the printed circuit board and a thickness of the printed circuit board.

4 Claims, 5 Drawing Sheets

APPARATUS AND METHOD FOR MANUFACTURING DOUBLE-SIDED MOUNTING SUBSTRATE

CROSS-REFERENCE TO RELATED PATENT APPLICATIONS

This application claims priority from Japanese Patent Application No. 2011-283576, filed on Dec. 26, 2011 in the Japan Patent Office, and Korean Patent Application No. 10-2012-0052205 filed on May 16, 2012, in the Korean Intellectual Property Office, the disclosures of which are incorporated herein by reference in their entirety.

BACKGROUND

1. Field

Apparatuses and methods consistent with exemplary embodiments relate to an apparatus and method for manufacturing a mounting substrate by mounting electronic components such as IC chips on a substrate, and more particularly, to an apparatus and method for manufacturing a double-sided mounting substrate by mounting electronic components on both of upper and lower surfaces of a printed circuit board (PCB).

2. Description of the Related Art

In the related art, a mounting substrate manufacturing apparatus or an electronic component mounting apparatus is configured to be able to adsorb an electronic component provided by an electronic component supply unit by using an adsorption nozzle, transfer the adsorbed electronic component over a PCB, and mount the electronic component at a predetermined position on the PCB.

Also, a backup table is provided under the PCB that stays at a mounting position. The backup table includes a plate on which a plurality of backup pins is arranged. During the mounting of the electronic component, the backup table ascends and thus the backup pins of the backup table support a lower surface of the PCB. For example, Japanese Patent Publication No. 2006-237316 discloses such apparatus having the backup table with the backup pins.

On the other hand, Japanese Patent Publication No. 2010-56347 discloses another apparatus for manufacturing a double-sided mounting substrate where electronic components are mounted on both of upper and lower surfaces.

In the apparatus for manufacturing a double-sided mounting substrate, when a PCB is carried to a mounting position, electronic components may be already mounted on a lower surface of the PCB. Accordingly, the backup table needs to be lowered to avoid interference with the electronic components mounted on the lower surface of the PCB. The backup table needs to be raised when electronic components are mounted and then lowered again when the PCB is carried away from the mounting position after the mounting.

As such, in the apparatus for manufacturing a double-sided mounting substrate, there is a need to elevate and lower the backup table according to a series of processes such as carrying-in of a PCB, mounting electronic components, and carrying-out of a PCB.

In the related art, an air cylinder has been used as an elevation actuator of the related art backup table. A lower limit position of the backup table is set to a predetermined position based on the maximum height of an electronic component to be mounted on a PCB. In other words, in the related art apparatus for manufacturing a double-sided mounting substrate, a position where a predetermined clearance (gap) is added to the maximum height of an electronic component to be mounted is set as the lower limit position of the backup table. The backup table is elevated and lowered based on the set lower limit position.

As described above, since the elevation and descent of the backup table is repeated according to a series of processes such as the carrying-in of a PCB, the mounting of an electronic component, and the carrying-out of a PCB, reduction of elevation and descent time of the backup table greatly contributes to improvement of productivity. Thus, the reduction of elevation and descent time of a backup table is needed particularly for the apparatus for manufacturing a double-sided mounting substrate.

SUMMARY

One or more exemplary embodiments provide an apparatus and method for manufacturing a double-sided mounting substrate which may reduce elevation and descent time of a backup table.

According to an aspect of an exemplary embodiment, there is provided an apparatus for manufacturing a double-sided mounting substrate, in which a printed circuit board with mounted electronic components mounted on upper and lower surfaces of the printed circuit board is carried to a mounting position, new electronic components are mounted on the upper surface of the printed circuit board at the mounting position, and the printed circuit board is carried away from the mounting position after the new electronic components are mounted, the apparatus including: a backup table provided under the printed circuit board at the mounting position which supports the lower surface of the printed circuit board; and a servo motor which elevates and lowers the backup table, the servo motor elevates the backup table to mount the new electronic components and lowers the backup table to carry-in and to carry-away the printed circuit board based on a lower limit position of the backup table, and the lower limit position of the backup table may be a position separated downwardly from a reference surface at the mounting position by a distance obtained by adding a preset clearance to a sum of a maximum height of the mounted electronic components mounted on the lower surface of the printed circuit board and a thickness of the printed circuit board.

The apparatus for manufacturing a double-sided mounting substrate may further include: a data input unit which receives input for the maximum height of the mounted electronic components mounted on the lower surface of the printed circuit board and the thickness of the printed circuit board; a lower limit position calculation unit which calculates the lower limit position based on the input maximum height of the mounted electronic components and the thickness of the printed circuit board, and the preset clearance; and a servo operation command unit which sends a command to operate the servo motor based on the lower limit position calculated by the lower limit position calculation unit.

The backup table may include: a plate; and a plurality of backup pins provided on the plate to support the lower surface of the printed circuit board.

According to an aspect of another exemplary embodiment, there is provided a method for manufacturing a double-sided mounting substrate having a printed circuit board with mounted electronic components mounted on upper and lower surfaces of the printed circuit board, the method including: providing a backup table under the printed circuit board at a mounting position which supports the lower surface of the printed circuit board; setting a lower limit position; lowering the backup table to the lower limit position to carry in the printed circuit board to the mounting position; elevating the backup table to mount new electronic components on the upper surface of the printed circuit board at the mounting position; and lowering the backup table to the lower limit position to carry away the printed circuit board from the mounting position after the new electronic components are mounted, wherein the lower limit position comprises a position separated downwardly from a reference surface at the mounting position by a distance obtained by adding a preset clearance to a sum of a maximum height of the mounted electronic components mounted on the lower surface of the printed circuit board and a thickness of the printed circuit board.

The method may further include: receiving input for the maximum height of the mounted electronic components mounted on the lower surface of the printed circuit board and the thickness of the printed circuit board; calculating the lower limit position based on the input maximum height of the mounted electronic components and the thickness of the printed circuit board, and the preset clearance; and sending a command to operate the servo motor based on the calculated lower limit position.

According to an aspect of yet another exemplary embodiment, there is provided an apparatus for manufacturing a double-sided mounting substrate having a printed circuit board with mounted electronic components on upper and lower surfaces of the printed circuit board, the apparatus including: a backup table which moves between first and second positions; a servo motor which elevates and lowers the backup table between the first and second positions, wherein the first position comprises a position where the apparatus mounts a new electronic component on the upper surface of the printed circuit board, and the second position comprises a position separated downwardly from a reference surface by a distance obtained by adding a preset clearance to a sum of a maximum height of the mounted electronic components mounted on the lower surface of the printed circuit board and a thickness of the printed circuit board.

BRIEF DESCRIPTION OF THE DRAWINGS

The above and other aspects will become more apparent by describing in detail exemplary embodiments thereof with reference to the attached drawings in which.

DETAILED DESCRIPTION OF THE EXEMPLARY EMBODIMENTS

Figure 1:
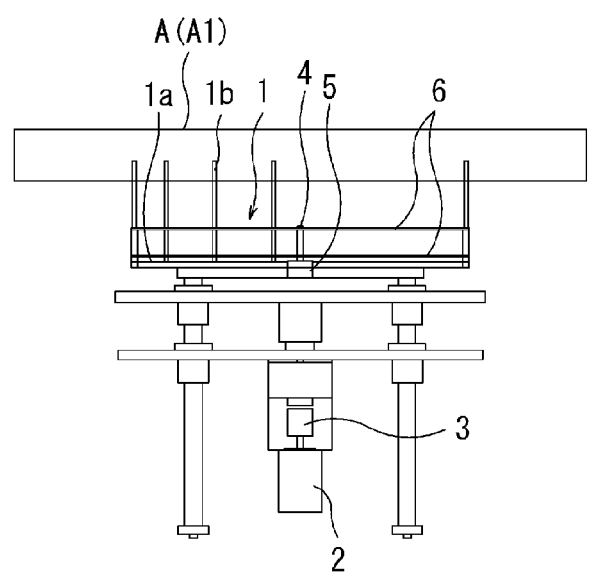
FIG. 1 is a front view schematically illustrating an apparatus for manufacturing a double-sided mounting substrate according to an exemplary embodiment.

The exemplary embodiments will be described more fully with reference to the accompanying drawings. Like reference numerals in the specification and drawings denote like elements, and thus their repetitive description will be omitted.

FIG. 1 is a front view schematically illustrating an apparatus for manufacturing a double-sided mounting substrate according to an exemplary embodiment. Referring to FIG. 1, a backup table 1 is arranged to be capable of elevating under a mounting position A1, where electronic components are mounted, in a transfer path A along which a printed circuit board (PCB) is transferred. The backup table 1 is configured such that a plurality of backup pins 1b is arranged on a plate 1a.

Also, a servo motor 2 is installed as an elevation actuator for elevating and lowering the backup table 1. The backup table 1 is elevated by the operation of the servo motor 2. In detail, a nut 5 is coupled to a screw shaft 4 that is connected to a motor shaft of the servo motor 2 via a gear train 3. The plate 1a of the backup table 1 is fixed to the nut 5. Accordingly, the screw shaft 4 is rotated by the operation of the servo motor 2 and thus the nut 5 moves up and down, thereby elevating and lowering the backup table 1. Also, in FIG. 1, a plurality of guide plates 6 guide elevation and descent of the backup pins 1b of the backup table 1.

Figure 2A:
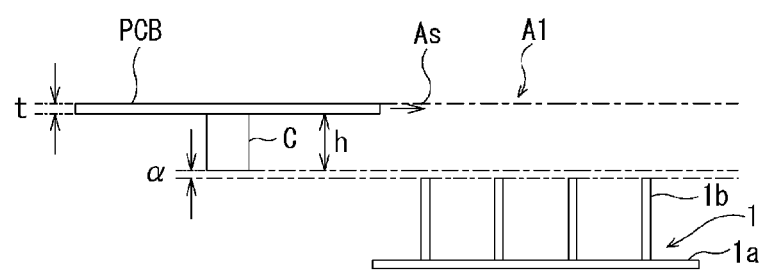
FIGS. 2A, 2B, and 2C are views schematically illustrating basic operations of the apparatus for manufacturing a double-sided mounting substrate of FIG. 1.
Figure 2B:
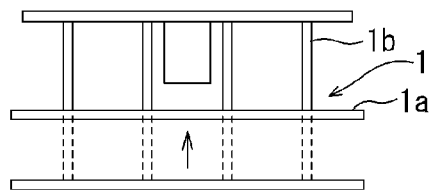
Figure 2C:
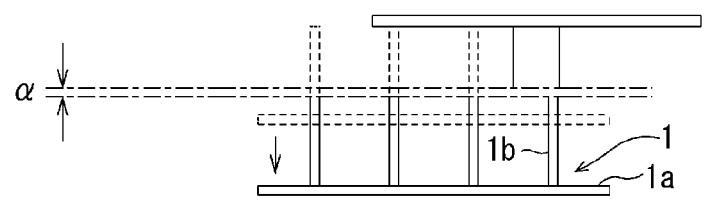

FIGS. 2A, 2B, and 2C are views schematically illustrating basic operations of the apparatus for manufacturing a double-sided mounting substrate of FIG. 1, in which a method for manufacturing a double-sided mounting substrate according to an exemplary embodiment is embodied.

FIG. 2A illustrates a state just before the PCB having an electronic component C mounted on a lower surface thereof is carried to a mounting position A1. At this time, the backup table 1 is lowered to a predetermined lower limit position to avoid interference with the electronic component C when the PCB is carried in.

In the present exemplary embodiment, the lower limit position of the backup table 1 is determined based on the maximum height h of the electronic component C already mounted on the lower surface of the PCB that is carried to the mounting position A1 and a thickness t of the PCB. In detail, the lower limit position of the backup table 1, that is, a surface of an upper end portion of each of the backup pins 1b, is determined to be a position where a predetermined clearance α is added to a sum of the maximum height h of the electronic component C and the thickness t of the PCB, based on the height of a reference surface As at the mounting position A1 matching a level of an upper surface of the PCB. In other words, the lower limit position is a position that is separated downward from the reference surface As at the mounting position A1 by a distance which can be expressed as "t+h+α".

When no component is mounted on the lower surface of the PCB, the maximum height h of the electronic component C is set to 0. Also, when a plurality of components is mounted on the lower surface of the PCB, the maximum height among the heights of the plurality of the mounted components is set to h. The clearance α is previously set in consideration of tolerance of the PCB and the electronic component and accuracy in horizontal transfer of the PCB.

When the PCB is carried to the mounting position A1, the backup table 1 is lowered to the lower limit position. When the PCB is positioned at the mounting position A1, as illustrated in FIG. 2B, the backup table 1 is raised and thus the backup pins 1b support the lower surface of the PCB. In this state, at least one electronic component (not shown) is mounted on an upper surface of the PCB.

Next, until the PCB is carried out after the mounting of an electronic component, the backup table 1 is lowered to the lower limit position as illustrated in FIG. 2C. The backup table 1 repeats the above elevation operation whenever an electronic component is mounted on the PCB.

The elevation and descent of the backup table 1 is performed by the operation of the servo motor 2 as described with reference to FIG. 1. In other words, the servo motor 2 operates the backup table 1 to elevate and lower with respect to the lower limit position.

Figure 3:
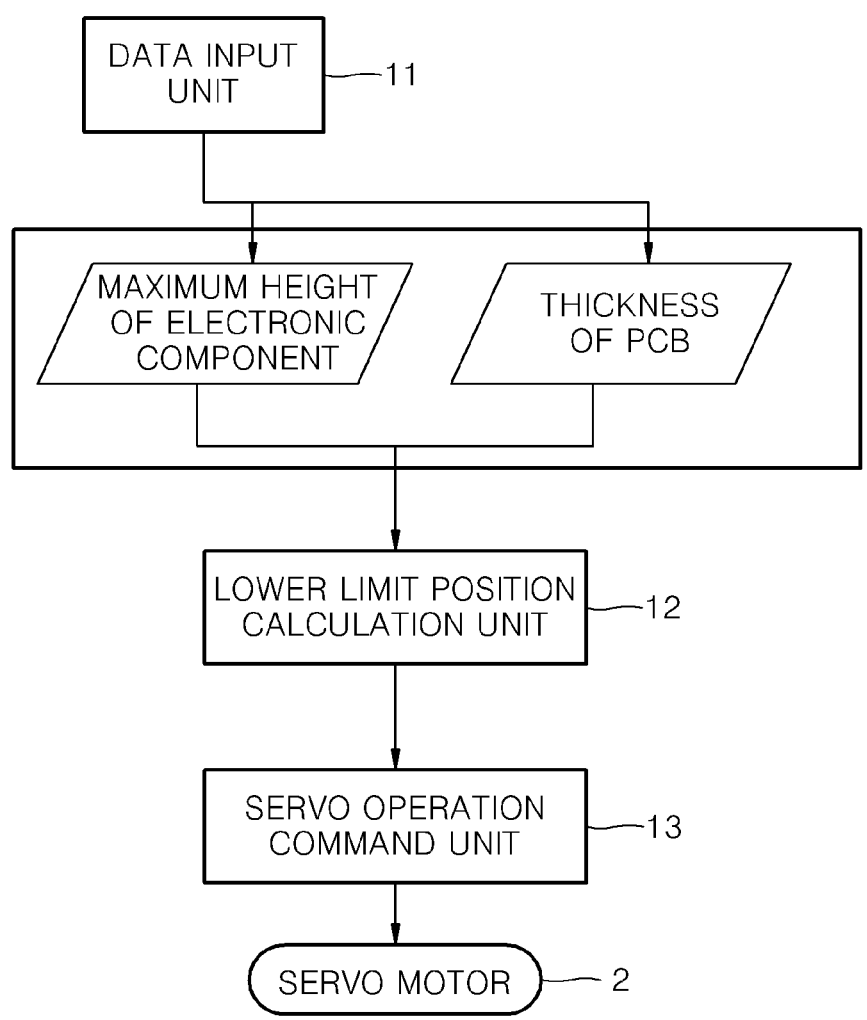
FIG. 3 is a block diagram schematically illustrating a structure for controlling an operation of a servo motor of the apparatus for manufacturing a double-sided mounting substrate of FIG. 1.

To control the operation of the servo motor 2, the apparatus for manufacturing a double-sided mounting substrate according to the present exemplary embodiment includes a data input unit 11, a lower limit position calculation unit 12, and a servo operation command unit 13, as illustrated in FIG. 3.

The data input unit 11 receives inputs of the maximum height h of the electronic component C that is already mounted on the lower surface of the PCB that is carried to the mounting position A1 and the thickness t of the PCB.

Data of the maximum height h of the electronic component C and the thickness t of the PCB may be obtained from a production program (a production plan data) and the input data is stored in a memory (not shown). The maximum height h of the electronic component C and the thickness t of the PCB may be put into a database according to the type of the PCB.

The lower limit position calculation unit 12 calculates the lower limit position described with reference to FIG. 2 based on the maximum height h of the electronic component C and the thickness t of the PCB, which are input, and a predetermined clearance α that is preset. In other words, the lower limit position is a position that is separated from the reference surface As at the mounting position A1 downward by a distance that "the maximum height h of an electronic component+the thickness t of a PCB+clearance α".

The servo operation command unit 13 issues a command to operate the servo motor 2 based on the lower limit position calculated by the lower limit position calculation unit 12.

Figure 4:
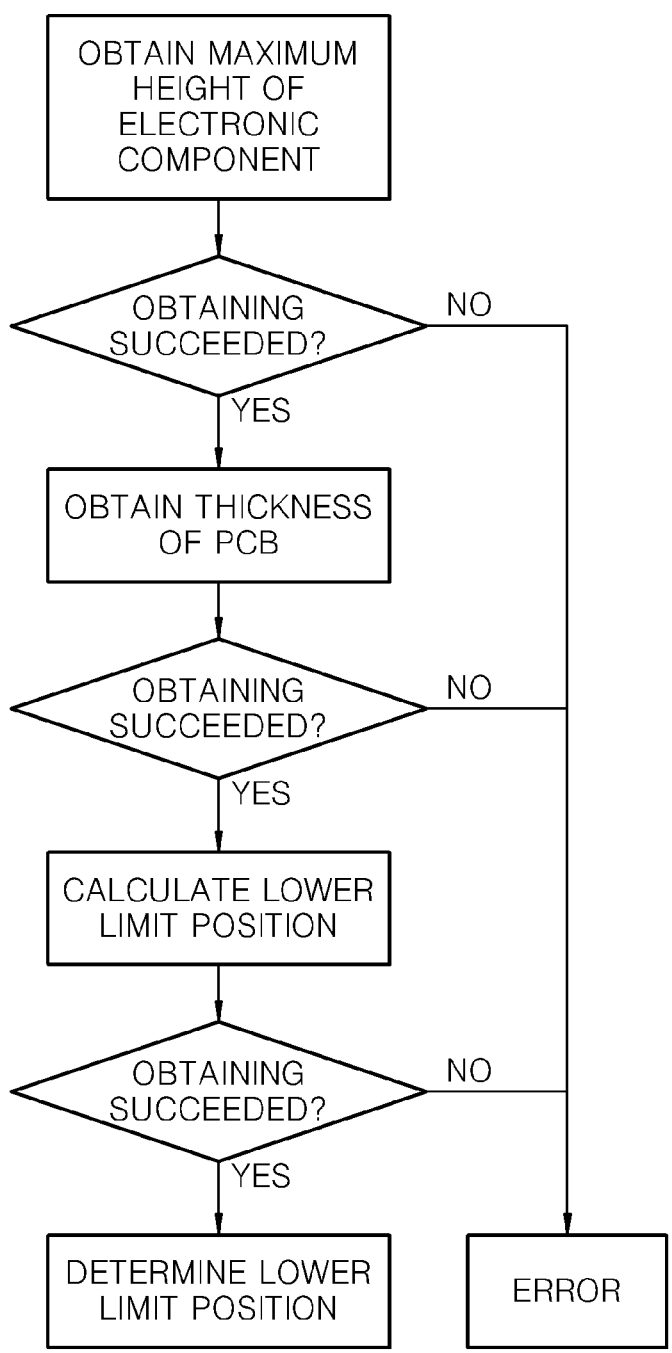
FIG. 4 is a flowchart for illustrating a process flow of a lower limit position calculation unit of FIGS. 3.

FIG. 4 is a flowchart for illustrating a process flow of the lower limit position calculation unit 12 of FIG. 3. Referring to FIG. 4, the lower limit position calculation unit 12 checks whether the maximum height h of the electronic component C and the thickness t of the PCB stored in the memory are successfully obtained and calculates a lower limit position in the above-described manner. The lower limit position calculation unit 12 determines the lower limit position by checking whether the calculation of the lower limit position is successful and transmits the determined lower limit position to the servo operation command unit 13 of FIG. 3.

Figures 5A, 5B:
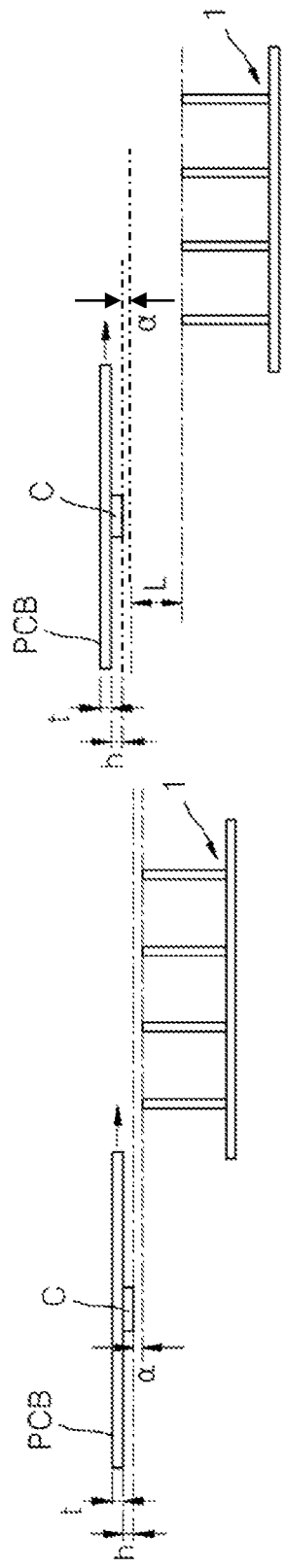
FIGS. 5A and 5B are views schematically illustrating a difference in an elevation stroke between a backup table according to an exemplary embodiment and a backup table of the related art technology.

FIGS. 5A and 5B are views schematically illustrating a difference in an elevation stroke between a backup table according to an exemplary embodiment and a backup table of the related art technology In FIG. 5A illustrates a case according to an exemplary embodiment and FIG. 5B illustrates a case according to the related art technology. In the case shown in FIG. 5A, the backup table 1 elevates based on the lower limit position that is obtained by adding the clearance α to the sum of the maximum height h of the electronic component C and the thickness t of the PCB downwardly from the reference surface As at the mounting position A1. Thus, an elevation stroke of the backup table 1 may be reduced to a minimum distance.

In the case shown in FIG. 5B, as described in the background section of the present specification, the lower limit position is set to a position obtained by adding a predetermined clearance to the maximum height of an electronic component that is likely to be mounted. Thus, the lower limit position is set regardless of the maximum height of an actual electronic component mounted on a lower surface of a PCB.

Therefore, in comparison between an exemplary embodiment and the related art technology illustrated in FIG. 5B, the elevation stroke of the backup table 1 according to the present exemplary embodiment as shown in FIG. 5A is reduced by a length L compared to the related art technology. Since the backup table 1 repeats elevation whenever an electronic component is mounted on a PCB, reduction in the elevation stroke may greatly contribute to improvement of productivity.

The present inventor has simulated an effect of improvement in productivity according to an exemplary embodiment. According to a result of the simulation, a transfer control time, which is a time from when a backup table 1 starts to descend at a mounting position to when a next PCB is carried to the mounting position and the backup table stops ascending, is about 5 seconds in the related art technology, whereas the transfer control time in the exemplary embodiment is about 3.7 seconds which is greatly reduced compared to the related art technology.

According to an exemplary embodiment, since the lower limit position of the backup table 1 is determined based on data about the maximum height h of the electronic component already mounted on the lower surface of the PCB that is carried to the mounting position A1, and the thickness t of the PCB, an elevation and descent stroke of the backup table 1 may be reduced to a minimum distance. Thus, the elevation and descent time of the backup table may be reduced and thus productivity may be improved.

Also, according to an exemplary embodiment, since a servo motor 2 is used for elevating and lowering the backup table, the elevation and descent of the backup table 1 may be precisely controlled. Furthermore, in the exemplary embodiment, productivity may be improved because the servo motor 2 needs no standby time while an air cylinder used in a related art technology needs standby time to stabilize.

While exemplary embodiments been particularly shown and described above, it will be understood by those of ordinary skill in the art that various changes in form and details may be made therein without departing from the spirit and scope of the present inventive concept as defined by the following claims.

What is claimed is:

1. An apparatus for manufacturing a double-sided mounting substrate, in which a printed circuit board with mounted electronic components mounted on upper and lower surfaces of the printed circuit board is carried to a mounting position, new electronic components are mounted on the upper surface of the printed circuit board at the mounting position, and the printed circuit board is carried away from the mounting position after the new electronic components are mounted, the apparatus comprising:

a backup table provided under the printed circuit board at the mounting position which supports the lower surface of the printed circuit board; and a servo motor configured to elevate and lower the backup table, wherein the servo motor is configured to elevate the backup table to mount the new electronic components and configured to lower the backup table to carry-in and to carry-away the printed circuit board based on a lower limit position of the backup table, wherein the lower limit position of the backup table comprises a position separated downwardly from a reference surface at the mounting position by a distance obtained by adding a preset clearance to a sum of a maximum height of the mounted electronic components mounted on the lower surface of the printed circuit board and a thickness of the printed circuit board, and wherein the apparatus further comprises:

a data input unit configured to receive input for the maximum height of the mounted electronic components mounted on the lower surface of the printed circuit board and the thickness of the printed circuit board;

a lower limit position calculation unit configured to calculate the lower limit position based on the input maximum height of the mounted electronic components and the thickness of the printed circuit board, and the preset clearance; and a servo operation command unit configured to send a command to operate the servo motor based on the lower limit position calculated by the lower limit position calculation unit.

2. The apparatus of claim 1, wherein the backup table comprises:

a plate; and a plurality of backup pins provided on the plate to support the lower surface of the printed circuit board.

3. An apparatus for manufacturing a double-sided mounting substrate having a printed circuit board with mounted electronic components on upper and lower surfaces of the printed circuit board, the apparatus comprising:

a backup table configured to move between first and second positions;

a servo motor configured to elevate and lower the backup table between the first and second positions, wherein the first position comprises a position where the apparatus mounts a new electronic component on the upper surface of the printed circuit board, and the second position comprises a position separated downwardly from a reference surface by a distance obtained by adding a preset clearance to a sum of a maximum height of the mounted electronic components mounted on the lower surface of the printed circuit board and a thickness of the printed circuit board, and wherein the apparatus further comprises:

a data input unit configured to receive input for the maximum height of the mounted electronic components mounted on the lower surface of the printed circuit board and the thickness of the printed circuit board;

a lower limit position calculation unit configured to calculate the lower limit position based on the input maximum height of the mounted electronic components and the thickness of the printed circuit board, and the preset clearance; and a servo operation command unit configured to send a command to operate the servo motor based on the lower limit position calculated by the lower limit position calculation unit.

4. The apparatus of claim 3, wherein the backup table comprises:

a plate; and a plurality of backup pins provided on the plate to support the lower surface of the printed circuit board.

* * * * *